United States Patent
Lee et al.

(10) Patent No.: US 7,684,772 B2
(45) Date of Patent: Mar. 23, 2010

(54) TUNER FOR COMPENSATING FOR TAKE-OVER POINT DEPENDING ON TEMPERATURE

(75) Inventors: Junghwan Lee, Yongin-si (KR); Bonkee Kim, Seongnam-si (KR)

(73) Assignee: Integrant Technologies Inc., Seongnam-Si (KR)

( * ) Notice: Subject to any disclaimer, the term of this patent is extended or adjusted under 35 U.S.C. 154(b) by 562 days.

(21) Appl. No.: 11/304,566

(22) Filed: Dec. 16, 2005

(65) Prior Publication Data

US 2006/0135102 A1 Jun. 22, 2006

(30) Foreign Application Priority Data

Dec. 17, 2004 (KR) .................. 10-2004-0107574

(51) Int. Cl.
*H01Q 11/12* (2006.01)
(52) U.S. Cl. .................. 455/127.3; 455/136; 455/138; 455/232.1; 455/234.1; 455/240.1; 455/241.1; 455/245.2; 455/247.1; 455/250.1; 455/251.1; 330/133; 330/278; 330/289
(58) Field of Classification Search .............. 455/136, 455/138, 219, 232.1–253.2, 127.2–127.5; 375/345; 330/129, 280, 133, 278, 289
See application file for complete search history.

(56) References Cited

U.S. PATENT DOCUMENTS

| | | | | |
|---|---|---|---|---|
| 4,152,667 A | * | 5/1979 | Visser | 330/278 |
| 5,153,822 A | * | 10/1992 | Yubazaki et al. | 700/11 |
| 6,496,017 B2 | * | 12/2002 | Bhat | 324/616 |
| 6,650,878 B1 | * | 11/2003 | Abe et al. | 455/232.1 |
| 6,687,489 B1 | * | 2/2004 | Lapid | 455/226.1 |
| 6,754,479 B1 | * | 6/2004 | Hughes et al. | 455/245.1 |
| 7,212,798 B1 | * | 5/2007 | Adams et al. | 455/251.1 |
| 2001/0028244 A1 | * | 10/2001 | Bhat | 324/76.35 |
| 2002/0191120 A1 | * | 12/2002 | Beales et al. | 348/735 |
| 2003/0153289 A1 | * | 8/2003 | Hughes et al. | 455/138 |
| 2003/0193370 A1 | * | 10/2003 | Leifso et al. | 330/254 |
| 2003/0207674 A1 | * | 11/2003 | Hughes | 455/234.1 |
| 2003/0232609 A1 | * | 12/2003 | Yates | 455/232.1 |
| 2004/0087288 A1 | * | 5/2004 | Lapid | 455/136 |
| 2006/0105769 A1 | * | 5/2006 | Flondro et al. | 455/437 |

* cited by examiner

*Primary Examiner*—Edward Urban
*Assistant Examiner*—Junpeng Chen
(74) *Attorney, Agent, or Firm*—Foley & Lardner LLP (57) ABSTRACT

A tuner down-converts a Radio Frequency (RF) wireless signal and outputs the converted signal. The tuner compensates for a TOP depending on a temperature and: detects a received signal strength depending on a RF output of the tuner and transmitting the detected strength to a gain control unit; measures an operating temperature of the tuner and transmits the measured temperature value; receives the measured temperature value to compare the received temperature value with a reference TOP value, compensating compensates for the TOP value depending on variation in temperature and outputting outputs the compensated value; and receives the compensated value to control the RF output based on the TOP value and the received signal strength.

10 Claims, 6 Drawing Sheets

TUNER FOR COMPENSATING FOR TAKE-OVER POINT DEPENDING ON TEMPERATURE

BACKGROUND OF THE INVENTION

1. Field of the Invention

The present invention relates to temperature compensation of a tuner, and more particularly, to a tuner in which Take-Over Point (TOP) is compensated for according to a temperature.

2. Background of the Related Art

Figure 1:
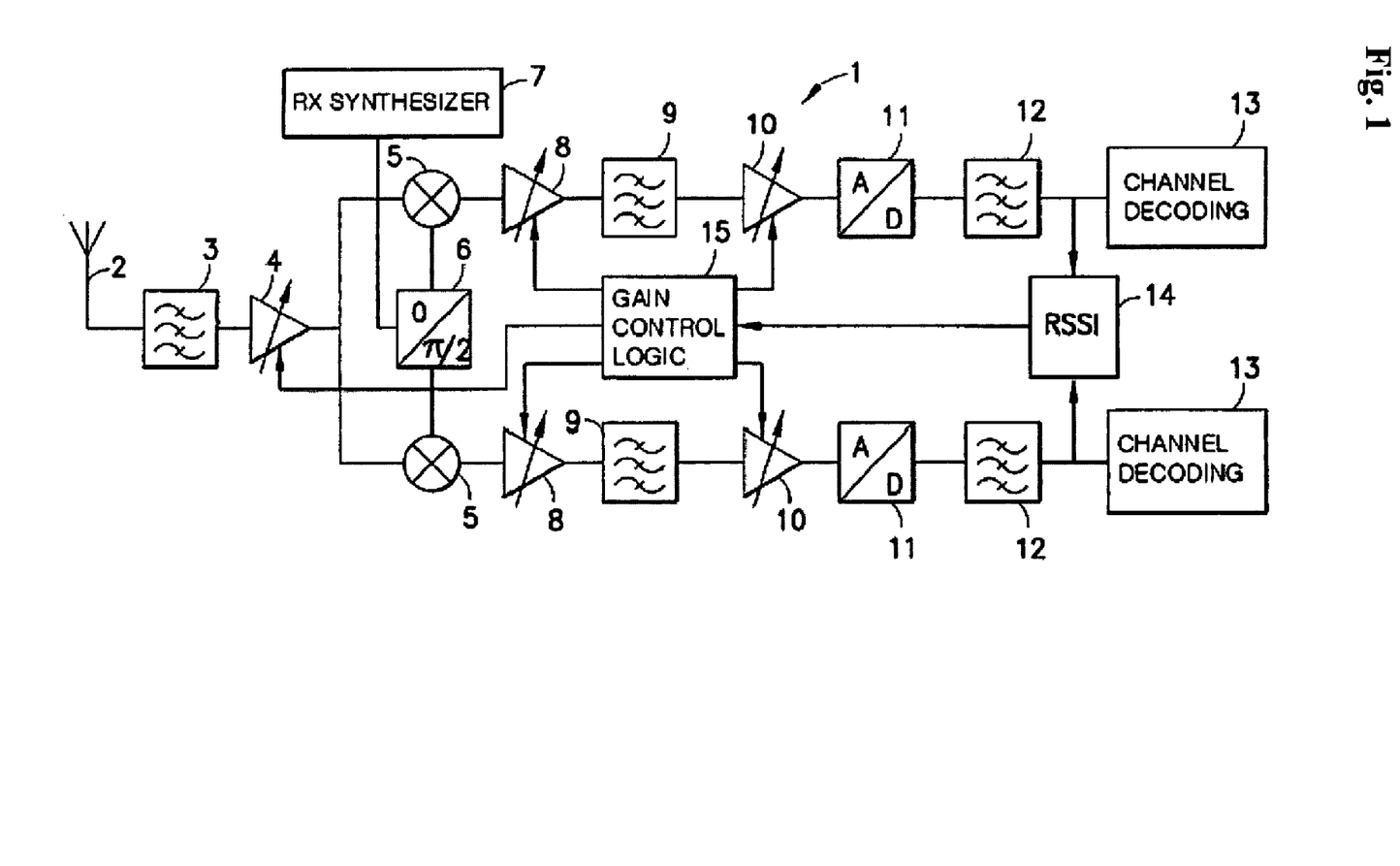
FIG. 1 shows the construction of a tuner according to the related art.

FIG. 1 shows the construction of a tuner according to the related art.

FIG. Shows a tuner (receiver) 1 according to the related art.

After a received signal passes through an antenna 2, a bandpass filter 3 located at the front end of a first (variable) amplification stage 4 selects a desired frequency band (e.g., WCDMA/GSM, etc.).

The bandpass filter 3 can be a part of a dual filter shape such as duplexer mode including a transmission-side bandpass filter.

A mixer 5 down-converts the filtered signal into a zero Intermediate Frequency (IF) by using an orthogonal local oscillator signal (6) (whose phase is shifted by 90 degrees), which is tuned by a RX synthesizer 7 of a carrier frequency of a received channel.

The down-converted signal is adapted to bandpass filters 8, 10 and a filter 9. In a digital communication system, this information is converted into digital form by an A/D converter 11 and is then digitally filtered (12).

Channel decoding (13) and other digital functions necessary to recover received information are performed after the operation by the A/D converter (11).

A gain control function is an important function in that a range of an input signal is extended such that it can be used in all kinds of tuners. A signal of a Received Signal Strength Indicator (RSSI) block 14 is supplied to a gain control logic block 15 that maintains a received signal to a desired level by controlling the gains of the amplifiers 4, 8 and 10.

In the conventional tuner, however, a Radio Frequency (RF) gain can be kept constant by the gain control unit and the RSSI. A TOP in which a RF gain falls depending on variation in temperature outside the tuner is varied. Due to this, a problem arises because a signal to noise (S/N) ratio is not kept constant.

SUMMARY OF THE INVENTION

Accordingly, the present invention has been made in view of the above problems occurring in the prior art, and it is an object of the present invention to provide a tuner in which influence depending on variation in temperature can be minimized by changing TOP according to a temperature.

To achieve the above object, according to the present invention, there is provided a tuner that down-converts a RF wireless signal and outputs the converted signal, wherein the tuner compensates for a TOP depending on a temperature and includes: received signal strength detection means for detecting a received signal strength depending on a RF output of the tuner and transmitting the detected strength to a gain control unit; temperature measurement means for measuring an operating temperature of the tuner and transmitting the measured temperature value; a compensation unit for receiving the measured temperature value from the temperature measurement means to compare the received temperature value with a reference TOP value, compensating for the TOP value depending on variation in temperature and outputting the compensated value; and a gain control unit for receiving the compensated value from the compensation unit to controls the RF output based on the TOP value and the received signal strength received from the received signal strength detection means.

The reference TOP value may be a value when normal temperature is a reference, and may be a value at about 25° C.

A measurement range of the temperature measurement means may be set to be in the range of −50° C. to 100° C.

The tuner may further include an analog-to-digital (A/D) converter that converts an analog value measured by the temperature measurement means into a digital value. In the A/D converter, control bit values may be set as 5-bit depending on a temperature.

The tuner may further include an A/D converter that converts an analog value measured by the temperature measurement means into a digital value. In the A/D converter, control bit values may be set as 5-bit depending on a temperature. A measurement range of the temperature measurement means may be set to be in the range of −50° C. to 100° C.

Furthermore, the reference TOP value may have a constant TOP value at a first reference temperature falling within a predetermined range from a normal temperature, which is measured by the temperature measurement means and is used as a reference, a TOP value compensated for by a value, which is increased by a predetermined value from the reference TOP value below the lowest value of the first reference temperature, and a TOP value compensated for by a value, which is decreased by a predetermined value from the reference TOP value below the highest value of the first reference temperature.

The first reference temperature may be set to be within a range of −15° C. to 50° C.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

The present invention will now be described in detail in connection with preferred embodiments with reference to the accompanying drawings.

Figure 2:
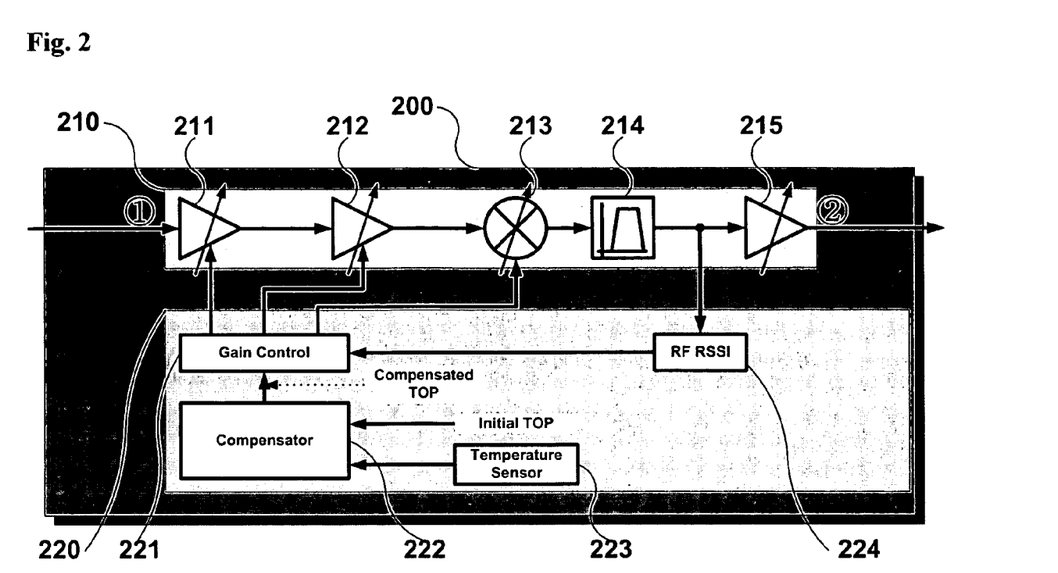
FIG. 2 is a block diagram of a tuner for compensating for TOP according to a temperature according to an embodiment of the present invention.

FIG. 2 is a block diagram of a tuner for compensating for TOP according to a temperature according to an embodiment of the present invention.

As shown in FIG. 2, the tuner 200 includes a receive unit 210 and a gain compensation unit 220.

The receive unit 210 includes a Low Noise Amplifier (LNA) 211, a Programmable Gain Amplifier (PGA) 212, an Image-Rejection Mixer (IRM) 213, a Low Pass Filter (LPF) 214 and an Intermediate Frequency Variable Gain Amplifier (IF VGA) 215.

The gain compensation unit 220 includes a gain controller 221, a compensation unit 222, a temperature sensor 223 and a RSSI 224.

The LNA 211 of the receive unit 210 functions to amplify a received signal while decrease noise signal included in the received signal. The PGA 212 of the receive unit 210 amplifies the signal with improved linearity within a predetermined range, which has been amplified by the LNA 201.

The IRM 213 rejects parasitic frequency from the signal, which has been amplified by the LNA 211 and the PGA 212 by filtering an image frequency so that the signal can be subjected to image-rejection down-conversion. The IRM 213 separates a RF stage and an IF stage and can secure stability of the receive unit 210.

The LPF 214 of the receive unit 210 allows a specific low pass frequency band to pass through it. The filtered signal is again amplified by the IF VGA 215.

In this case, since a weak received signal cannot be sufficiently amplified to become a desired signal only by the LNA 211 of the receive unit 210, the IF VGA 215 for fine power control is used to amplify a signal with a predetermined gain.

The gain control unit 221 of the gain compensation unit 220 outputs a control signal in order to compensate for respective gains of the LNA 211, the PGA 212 and the IRM 213.

The compensation unit 222 of the gain compensation unit 220 compensates for a TOP value depending on a temperature based on an initial TOP value and a temperature, which is measured by the temperature sensor 223, and transmits the compensated TOP value to the gain controller 221.

The temperature sensor 223 of the gain compensation unit 220 can be a sensor that can sense a temperature up to +100° C. on the basis of −50° C.

The RSSI 224 of the gain compensation unit 220 measures a strength of a signal output from the LPF 214 of the receive unit.

In the tuner 200, a gain of each of the LNA 211, the PGA 212 and the IRM 213 of the RF stage is changed depending on a temperature. A TOP is changed depending on variation in gain. As the TOP is varied, the SNR is changed.

As a result, a constant SNR can be obtained by compensating for a TOP in consideration of a gain value that is varied depending on a temperature.

A TOP value, which will be compensated for in the compensation unit 222, is generated based on the initial TOP value and a temperature detected by the temperature sensor 223 and is then applied to the gain control unit 221.

The gain control unit 221 sends a control signal to the LNA 211, the PGA 212 and the IRM 213 of the RF stage so that a value of an output signal of the LPF 214 can be kept constant on the basis of the strength of the signal measured by the RSSI 224 and the TOP value compensated for by the compensation unit 222.

If the TOP value is compensated for as described above, a SNR can be kept constant. This will be described in detail with reference to FIGS. 3 and 4.

Figure 3:
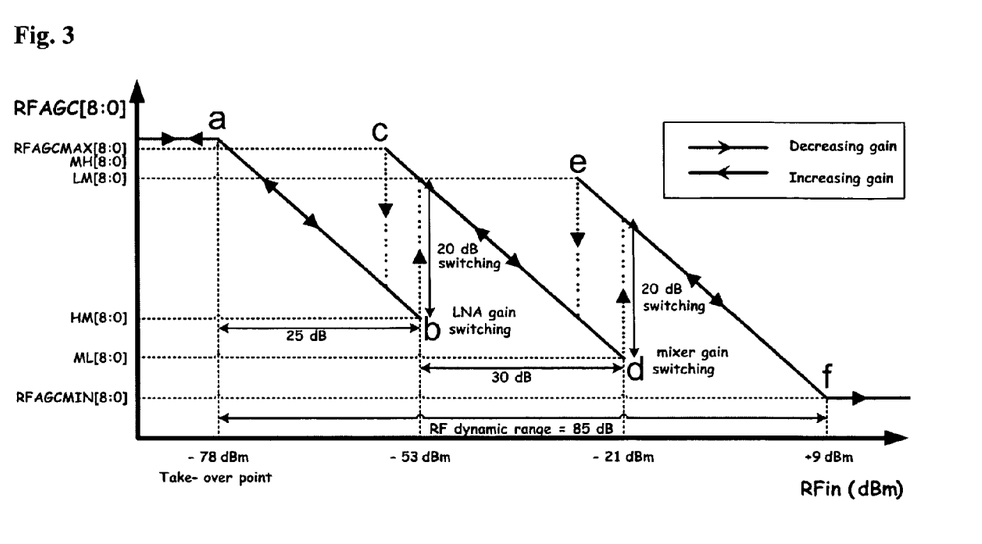
FIG. 3 shows a RF gain curve according to the present invention.

FIG. 3 shows a RF gain curve according to the present invention.

The RF gain curve shown in FIG. 3 indicates a RF AGC value with respect to RF input as a graph.

A gain from a point "a" to a point "b" indicates a gain part in the PGA having a gain value that is varied depending on a temperature. This part is a part whose TOP value varied depending on a temperature should be compensated for.

Points "c", "d", "e" and "f" are parts whose gain is compensated for by correcting a gain of the LNA 211 or the IRM 213.

A gain value of initial Rfin is amplified to have the highest value of RF AGC[8:0] having a 9-bit control value up to −78 dBm.

If an input value is lower than TOP value −78 dBm, RFAGC[8:0] has the highest value. If the input value becomes high, the SNR is increased as much as the input value is increased.

If the input value becomes higher than TOP value −78 dBm, the RF gain is reduced while RFAGC[8:0] is reduced. The SNR has a constant value while the signal is increased.

TOP compensation depending on variation in temperature according to the present invention is a part from the point "a" to the point "b". The relation between the TOP and the SNR depending on variation in temperature in a part from the point "a" to the point "b" will be described below with reference to FIG. 4.

Figure 4A:
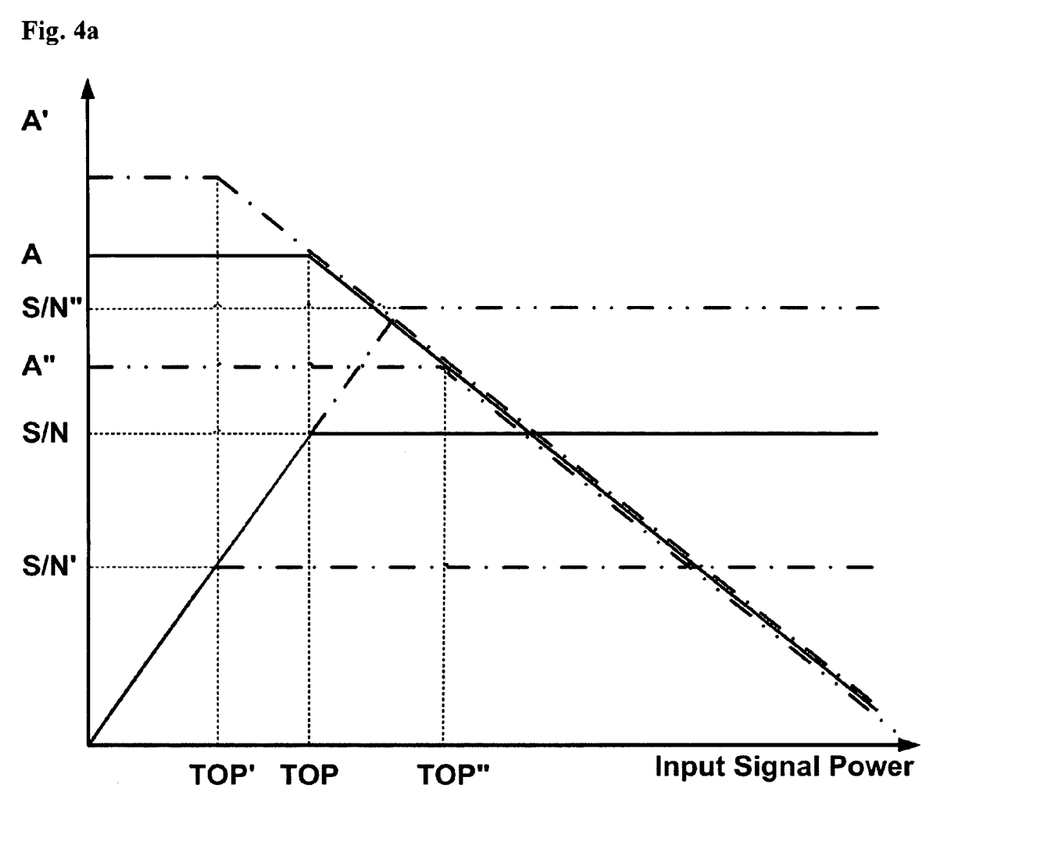
FIG. 4 is a graph for illustrating the relation between TOP and SNR depending on variation in gain.
Figure 4B:
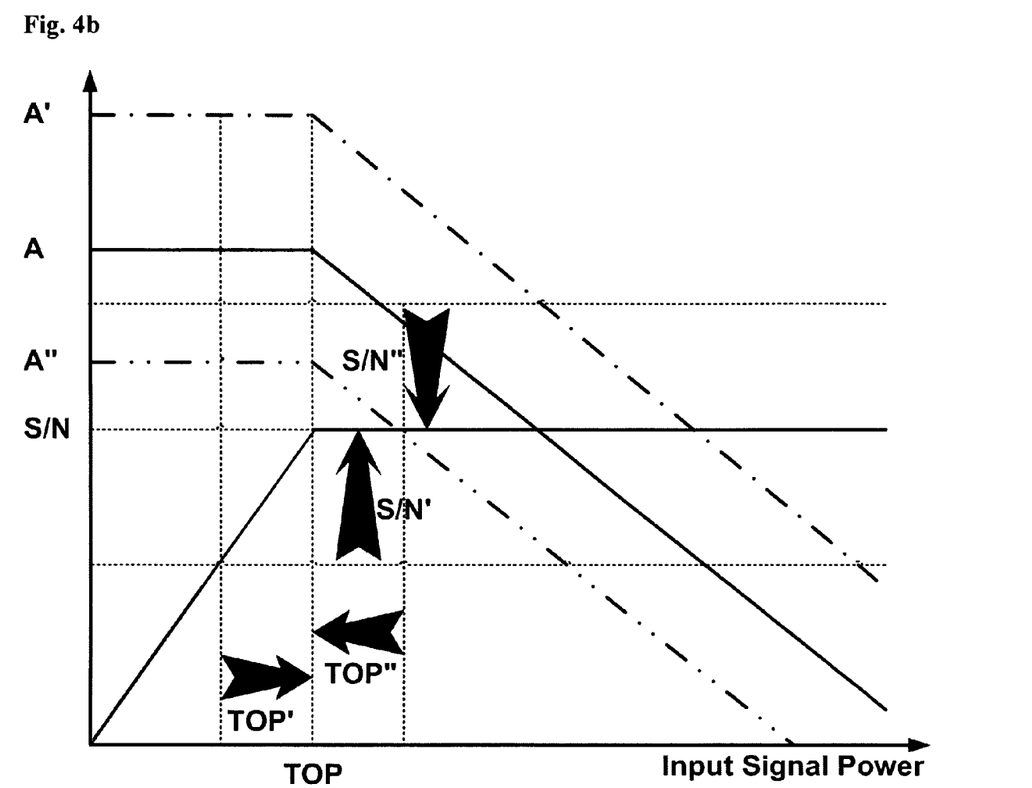

FIG. 4 is a graph for illustrating the relation between TOP and SNR depending on variation in gain. FIG. 4a shows the relation between the TOP and the SNR before TOP compensation and FIG. 4b shows the relation between the TOP and the SNR after TOP compensation.

In addition, in the graph of FIGS. 4a and 4b, solid line indicates the relation between the TOP and the SNR in a standard temperature, chain dashed line indicates the relation between the TOP and the SNR when a temperature falls from the standard temperature, and chain double-dashed line indicates the relation between the TOP and the SNR when a temperature rises from the standard temperature.

As shown in FIG. 4a, in the case where there is no TOP compensation, if a temperature falls (chain dashed line), a RF gain rises (A→A'). A value of an output signal keeps constant by the RF RSSI 224 and the gain control unit 221. Therefore, a falling point of the RF gain is decided at TOP' and the SNR value is lowered accordingly.

On the other hand, as shown in FIG. 4b, in the case where there is TOP compensation, if a temperature falls (chain dashed line), the RF gain rises (A→A'). Although a value of an output signal is kept constant by the RF RSSI 224 and the gain control unit 221, TOP' has to be compensated for as much as TOP. Therefore, while the RF gain maintains the same value as the gain value before TOP compensation, the falling point of the RF gain is decided to have the same point as that of the standard temperature. The SNR value becomes the same as that in the standard temperature. The SNR value can be kept constant.

A case where a temperature rises (chain double-dashed line) is the same as a case where the temperature falls.

For example, in a tuner or device in which the highest gain of RF is 48 dB and the TOP is −78 dBm at 25° C., if the temperature falls to −40° C., the gain is increased by 10 dB compared with a normal temperature 48 dB, resulting in 58 dB. Therefore, a value of the LPF output, i.e., the input of RF RSSI is increased by 10 dB and RFAGC[8:0] of the tuner is reduced at −78 dBm. The TOP is changed to −88 dBm.

Therefore, the SNR is increased up to the TOP value. Since the TOP is reduced by 10 dB, a problem arises because the SNR is also reduced by 10 dB.

That is, in the case of a device whose TOP is changed from −78 dBm at 25° C. to −88 dBm at −40° C., if the TOP value is kept to −78 dBm by compensating for the TOP value by −10 dB, the SNR has a constant value. Therefore, even if the temperature and the input are changed, the output is constant.

In this case, −10 dB is controlled using a TOP control value. Decision of the control value will be described below in detail with reference to FIG. 5.

Figure 5:
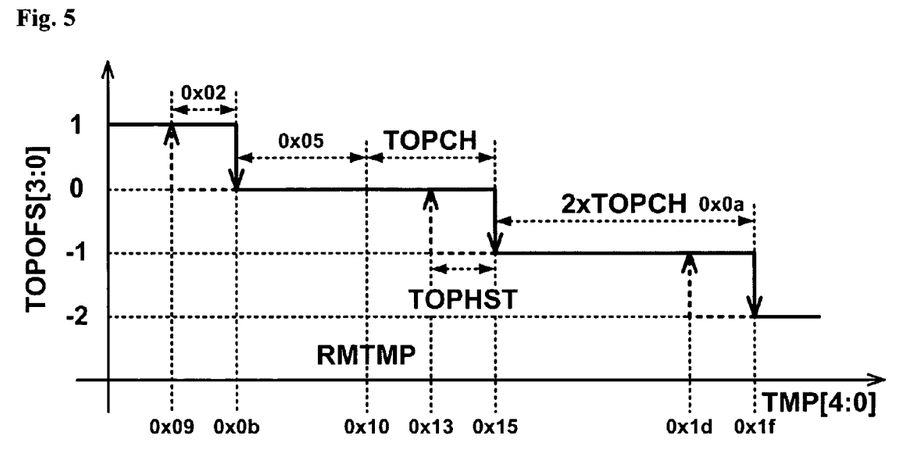
FIG. 5 shows a TOP conversion procedure according to the present invention.

FIG. 5 shows a TOP conversion procedure according to the present invention.

FIG. 5 shows a TOP compensation Take-over point Offset (TOPOFS)[3:0] conversion value depending on a temperature TMP[4:0]. There is shown variation in a TOPOFS value depending on an operating temperature TMP[4:0] value of a device.

Terms used in the graph shown in FIG. 5 and the following Equation can be defined as follows.

TMP (Temperature)[4:0] indicates a digital value of a temperature. Since 5-bit is used, TMP has a total of 32 states.

TOPI2C (Take-over point Inter IC bus) indicates a TOP value that is initially set.

TOPOFS (Take-over point Offset)[3:0] indicates a 4-bit value of a TOP that should be compensated for according to TMP.

RMTMP (Room Temperature)[4:0] indicates a 5-bit value of TMP[4:0] at normal temperature.

TOPHST (Take-over point Hysteresis)[4:0] indicates a difference in the 5-bit value of the TMP[4:0] when the TOP falls and rises.

TOPCH (Take-over point Change)[4:0] indicates a difference between RMTMP in which the TOP falls and the 5-bit value of TMP[4:0].

TOP compensation control depending on variation in temperature according to the present invention can be performed as follows.

A gain generated in the region ranging from the point "c" to the point "f" shown in FIG. 3 is compensated for through control of other compensation circuit. This can be expressed in the following Equation 1.

$$TOP = TOPI2C \quad (1)$$

where TOPI2C can be adjusted manually.

In the region ranging from the point "a" to the point "b" shown in FIG. 3, the sum of the TOPI2C value that is initially set and the TOPOFS value, i.e., the compensation value of the TOP value depending on variation in temperature is derived. This can be expressed in the following Equation 2.

$$TOP = TOPI2C + TOPOFS \quad (2)$$

where $0 \leq TOPI2C \geq b$.

That is, the lowest value TOPmin of TOPOFS is "0" and the highest value TOPmax of TOPOFS is "b".

As a result, in the region of the points "c", "d", "e" and "f" shown in FIG. 3, the TOP has the same value as a TOPI2C value and the gain of TOPI2C is manually controlled. If the TOPI2C value is "0" or higher or "b" or less, however, TOP is the sum of the TOPI2C and TOPOFS values. The lowest value TOPmin of TOPOFS becomes "0" and the highest value TOPmax thereof becomes "b".

TOP correction of a device temperature in accordance with the present invention can be expressed in the following table.

In addition, if an ambient temperature of a device is 85° C. before TOP correction, TOP (dBm) is −68 dBm. However, TOP (dBm) is −77 dBm after TOP correction.

However, in the case of normal temperature of 25° C., there is no correction. Therefore, TOP (dBm) before and after correction is the same, i.e., −78 dBm.

In this case, assuming that the TOP value before correction is 5 when a temperature is 5-bit and 32 state, the TOP has a constant value before correction. If there is TOP correction depending on variation in temperature, however, the TOP is 5 at −40° C., 5 at 25° C. and 2 at 85° C.

A case where a temperature falls will be described with reference to FIGS. 4(a), 4(b) and 5. In the case where a temperature falls, the gain rises and the SNR falls. In this case, if a TOP value is compensated for by a control signal for TOP compensation (TOP->TOP' in FIG. 4 and 88 dBm->−79 dBm in FIG. 5), the SNR value is kept to a value at normal temperature, as shown in FIG. 4(b). That is, during the process in which a temperature of a device is changed to change the gain, and the gain is changed to change the TOP, if TOP that is changed according to a temperature is compensated for, the TOP value can be kept constant. As a result, it is possible to keep the SNR constant.

Figure 6:
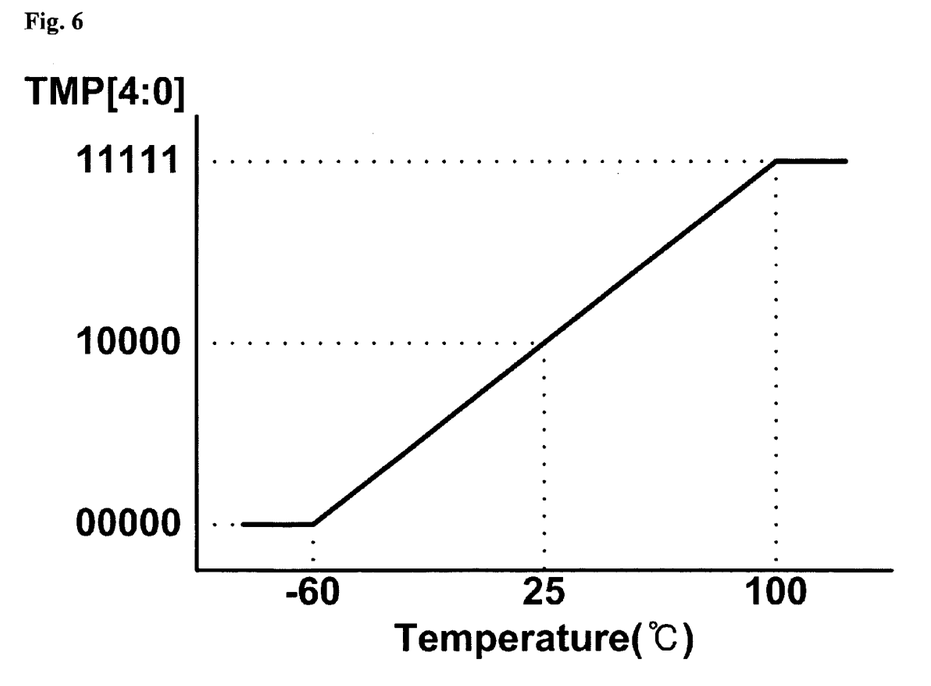
FIG. 6 shows a characteristic curve of a temperature sensor according to the present invention.

FIG. 6 shows a characteristic curve of a temperature sensor according to the present invention.

In FIG. 6, digital output values of the temperature sensor for control, which is related to TOP compensation depending on a temperature, are shows as a curve. FIG. 6 shows control bit values depending on operating temperatures of the device from −50° C. to 100° C.

That is, a temperature from −50° C. to 100° C. is divided into 5-bit 32-state(TMP[4:0]) step by step. Each control bit value has resolution of 5° C. per 1-state.

In this case, the temperature is divided into [00000] to [11111] according to binary number.

An operation relating to temperature compensation is performed based on the digital values output from the temperature sensor.

The present invention can realize a tuner with less influence depending on variation in temperature by changing a TOP according to an operating temperature of the tuner.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

TABLE 1

| Item ° C. | RF Gain (dB) | | TOP (dBm) | | TOP | |
|---|---|---|---|---|---|---|
| | Before TOP correction | After TOP correction | Before TOP correction | After TOP correction | Before TOP correction | After TOP correction |
| −40 | 58 | 58 | −88 | −79 | 5 | 8 |
| 25 | 48 | 48 | −78 | −78 | 5 | 5 |
| 85 | 38 | 38 | −68 | −77 | 5 | 2 |

Table 1 shows a transition of variation in RF gain (dB), TOP (dBm) and TOP depending on a temperature and TOP correction.

That is, if an ambient temperature of a device is −40° C. before TOP correction, TOP (dBm) is −88 dBm. However, TOP (dBm) is −79 dBm after TOP correction.

What is claimed is:

1. A tuner for compensating TOP value in accordance with temperature comprising:
    a received signal strength detection unit for detecting a received signal strength depending on a RF output of the tuner and transmitting the detected strength to a gain control unit;

a temperature measurement unit for measuring an operating temperature of the tuner and transmitting the measured temperature value;

a compensation unit for receiving the measured temperature value from the temperature measurement unit and for receiving an initial TOP value, the compensation unit outputting a compensated TOP value that is obtained from a table of TOP values and temperature values; and the gain control unit for receiving the compensated TOP value from the compensation unit to control the RF output based on the compensated TOP value and the received signal strength received from the signal strength detection unit, wherein the compensated TOP value is maintained at a substantially constant value even when the operating temperature of the tuner fluctuates.

2. The tuner as claimed in claim 1, wherein the reference TOP value is a value when normal temperature is a reference.

3. The tuner as claimed in claim 2, wherein a measurement range of the temperature measurement unit is set to range from −50° C. to 100° C.

4. The tuner as claimed in claim 3, further comprising an analog-to-digital (A/D) converter that converts an analog value measured by the temperature measurement unit into a digital value, wherein in the A/D converter, control bit values are set as multi-bit values depending on a temperature.

5. The tuner as claimed in claim 3, further comprising an analog-to-digital (A/D) converter that converts an analog value measured by the temperature measurement unit into a digital value, wherein in the A/D converter, control bit values are set as multi-bit values depending on a temperature, a measurement range of the temperature measurement unit is set to be in the range of −50° C. to 100° C., and the reference TOP value has a constant TOP value at a first reference temperature falling within a predetermined range from a normal temperature, which is measured by the temperature measurement unit and is used as a reference, the TOP value compensated for by a first value, which is increased by a predetermined value from the reference TOP value below the lowest value of the first reference temperature, and the TOP value compensated for by a second value, which is decreased by a predetermined value from the reference TOP value below the highest value of the first reference temperature.

6. The tuner as claimed in claim 5, wherein first reference temperature is set within a range of −15° C. to 50° C.

7. The tuner as claimed in claim 1, wherein the detected received signal strength is greater than a first predetermined value, an output RF value of the tuner is maintained at a substantially constant value by changing output gain values of other hardware components connected to the tuner, and wherein when the detected received signal strength is less than or equal to the first predetermined value, the output RF value of the tuner is maintained at the substantially constant value by utilizing the compensated TOP value.

8. The tuner as claimed in claim 7, wherein the other hardware components include a mixer and a low noise amplifier.

9. The tuner as claimed in claim 1, wherein, in a case where the operating temperature of the tuner fluctuates from a first temperature value to a second temperature value that is less than the first temperature value, the RF output increases and the signal-to-noise ratio remains constant.

10. The tuner as claimed in claim 1, wherein, in a case where the operating temperature of the tuner fluctuates from a first temperature value to a second temperature value that is greater than the first temperature value, the RF output decreases and the signal-to-noise ratio remains constant.

* * * * *